US012708002B2

(12) United States Patent
Jeon et al.

(10) Patent No.: US 12,708,002 B2
(45) Date of Patent: Aug. 11, 2026

(54) SEMICONDUCTOR DEVICE

(71) Applicant: Samsung Electronics Co., Ltd., Suwon-si (KR)

(72) Inventors: Yoonyoung Jeon, Suwon-si (KR); Youngmin Kim, Suwon-si (KR); Joonseok Oh, Suwon-si (KR); Woongkeon Lee, Suwon-si (KR); Changbo Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 352 days.

(21) Appl. No.: 18/239,167

(22) Filed: Aug. 29, 2023

(65) Prior Publication Data

US 2024/0194577 A1 Jun. 13, 2024

(30) Foreign Application Priority Data

Dec. 12, 2022 (KR) ........................ 10-2022-0172769
Apr. 6, 2023 (KR) ........................ 10-2023-0045510

(51) Int. Cl.
*H10W 70/65* (2026.01)
*H10W 70/66* (2026.01)
(Continued)

(52) U.S. Cl.
CPC ........... *H10W 70/65* (2026.01); *H10W 70/66* (2026.01); *H10W 70/685* (2026.01); *H10W 74/111* (2026.01); *H10W 90/794* (2026.01)

(58) Field of Classification Search
CPC ........... H01L 23/49838; H01L 23/3107; H01L 23/49822; H01L 23/49866; H01L 23/3128; H01L 23/49816; H01L 23/5389; H01L 24/08; H01L 2224/08235; H01L 2924/3511; H01L 21/6835; H01L 2221/68345; H10W 70/65; H10W 70/66;
(Continued)

(56) References Cited

U.S. PATENT DOCUMENTS 8,766,418 B2 7/2014 Iwase et al.
9,793,228 B2 10/2017 Yajima
(Continued)

FOREIGN PATENT DOCUMENTS

CN 113097168 A 7/2021

*Primary Examiner* — Marlon T Fletcher
*Assistant Examiner* — Christina A Sylvia
(74) *Attorney, Agent, or Firm* — Muir Patent Law, PLLC

(57) ABSTRACT

A semiconductor package includes a first redistribution structure having at least one first redistribution layer and at least one first insulating layer that are alternately stacked, a semiconductor chip electrically connected to the first redistribution structure, a second insulating layer disposed above the semiconductor chip and having an opening, a pad electrically connected to the first redistribution structure, disposed on the second insulating layer, and overlapping the opening, a pad surface layer disposed on a first region of an upper surface of the pad to overlap the opening, the pad surface layer formed of a first conductive material different from a second conductive material forming the pad. The pad has an anchor portion protruding from a second region of the upper surface of the pad. The anchor portion protrudes to a position higher than that of a lower surface of the pad surface layer.

21 Claims, 11 Drawing Sheets

(51) Int. Cl.
*H10W 70/685* (2026.01)
*H10W 74/10* (2026.01)
*H10W 90/00* (2026.01)

(58) Field of Classification Search
CPC ............. H10W 70/685; H10W 74/111; H10W 90/794; H10W 72/90; H10W 70/614; H10W 90/701; H10W 74/117; H10P 72/74; H10P 72/7424
See application file for complete search history.

(56) References Cited

U.S. PATENT DOCUMENTS

| | | | | |
|---|---|---|---|---|
| 10,008,462 | B2 | 6/2018 | Seo et al. | |
| 10,916,484 | B2 | 2/2021 | Fehler et al. | |
| 2014/0084462 | A1 | 3/2014 | Hu et al. | |
| 2019/0206824 | A1* | 7/2019 | Lu | H01L 24/20 |
| 2021/0183785 | A1 | 6/2021 | Kwon | |
| 2022/0052006 | A1* | 2/2022 | Kang | H01L 24/14 |

* cited by examiner 300c
185
186 187 188
181
184 184J 184P
160
165
110T
115 111 112 113
110 115
251 254 118 117 116 119J 119P
250 111F OB4
Z
Y X

SEMICONDUCTOR DEVICE

CROSS-REFERENCE TO RELATED APPLICATION(S)

This application claims the benefit of priority under 35 U.S.C. § 119 to Korean Patent Application Nos. 10-2022-0172769 filed on Dec. 12, 2022 and 10-2023-0045510 filed on Apr. 6, 2023 in the Korean Intellectual Property Office, the disclosures of which are incorporated herein by reference in their entirety.

BACKGROUND

The present inventive concept relates to a semiconductor package.

In general, a semiconductor chip may be implemented as part of a semiconductor package such as a wafer level package (WLP) or a panel level package (PLP), and the semiconductor package may be used as an electronic component of a device.

The semiconductor package may include a redistribution layer for electrically connecting a semiconductor chip to a device or a circuit board (e.g., printed circuit board). The redistribution layer may have a structure in which a redistribution line, implemented to be finer than a wiring of a wiring layer of a general printed circuit board, extends horizontally within the semiconductor package. The redistribution layer may include multiple redistribution lines extending horizontally.

The redistribution line within the redistribution layer may be electrically connected to a bump to vertically extend an electrical connection path from the redistribution line. A pad may be disposed to overlap an opening of an insulating layer, and may be electrically connected to a bump disposed in the opening. The pad may be implemented as an under bump metallurgy (UBM).

SUMMARY

The present inventive concept provides a semiconductor package capable of efficiently improving the reliability (for example, delamination and cracking prevention performance) of a combination structure of a pad and an insulating layer.

According to an aspect of the present inventive concept, there is provided a semiconductor package including a first redistribution structure having at least one first redistribution layer and at least one first insulating layer that are alternately stacked, a semiconductor chip electrically connected to the first redistribution structure, a second insulating layer disposed above the semiconductor chip and having an opening, a pad electrically connected to the first redistribution structure, disposed on the second insulating layer, and overlapping the opening, and a pad surface layer disposed on a first region of an upper surface of the pad to overlap the opening, the pad surface layer formed of a first conductive material different from a second conductive material forming the pad. The pad may have an anchor portion protruding from a second region of the upper surface of the pad. The anchor portion may protrude to a position higher than that of a lower surface of the pad surface layer.

According to another aspect of the present inventive concept, there is provided a semiconductor package including a first redistribution structure having at least one first redistribution layer and at least one first insulating layer that are alternately stacked, a semiconductor chip electrically connected to the first redistribution structure, a second insulating layer disposed above the semiconductor chip and having an opening, a pad electrically connected to the first redistribution structure, disposed on the second insulating layer, and overlapping the opening, and a pad surface layer disposed on a first region of an upper surface of the pad to overlap the opening, the pad surface layer formed of a first conductive material different from a second conductive material forming the pad. The pad may further have a conductive via protruding from a lower surface of the pad and overlapping the pad surface layer in a vertical direction. The pad may further have an anchor portion disposed along an edge of the pad, the anchor portion having a form of a sawtooth inserted into the second insulating layer.

According to another aspect of the present inventive concept, there is provided a semiconductor package including a first redistribution structure having at least one first redistribution layer and at least one first insulating layer that are alternately stacked, a semiconductor chip disposed between the first redistribution structure and the second insulating layer, a second insulating layer disposed above the semiconductor chip and having an opening, a pad electrically connected to the first redistribution structure, disposed on the second insulating layer, and overlapping the opening, and a first pad surface layer disposed on a region of an upper surface of the pad to overlap the opening, the first pad surface layer formed of nickel (Ni) or an alloy of nickel, a second pad surface layer disposed on an upper surface of the first pad surface layer and overlapping the opening, the second pad surface layer formed of gold (Au) or an alloy of gold, and an encapsulant disposed between the first redistribution structure and the second insulating layer, the encapsulant encapsulating the semiconductor chip. The pad may have an anchor portion protruding from a second region of the upper surface of the pad. The anchor portion may protrude to a position higher than that of a lower surface of the first pad surface layer. A portion of the second insulating layer may be disposed in a space between the anchor portion and the first pad surface layer.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
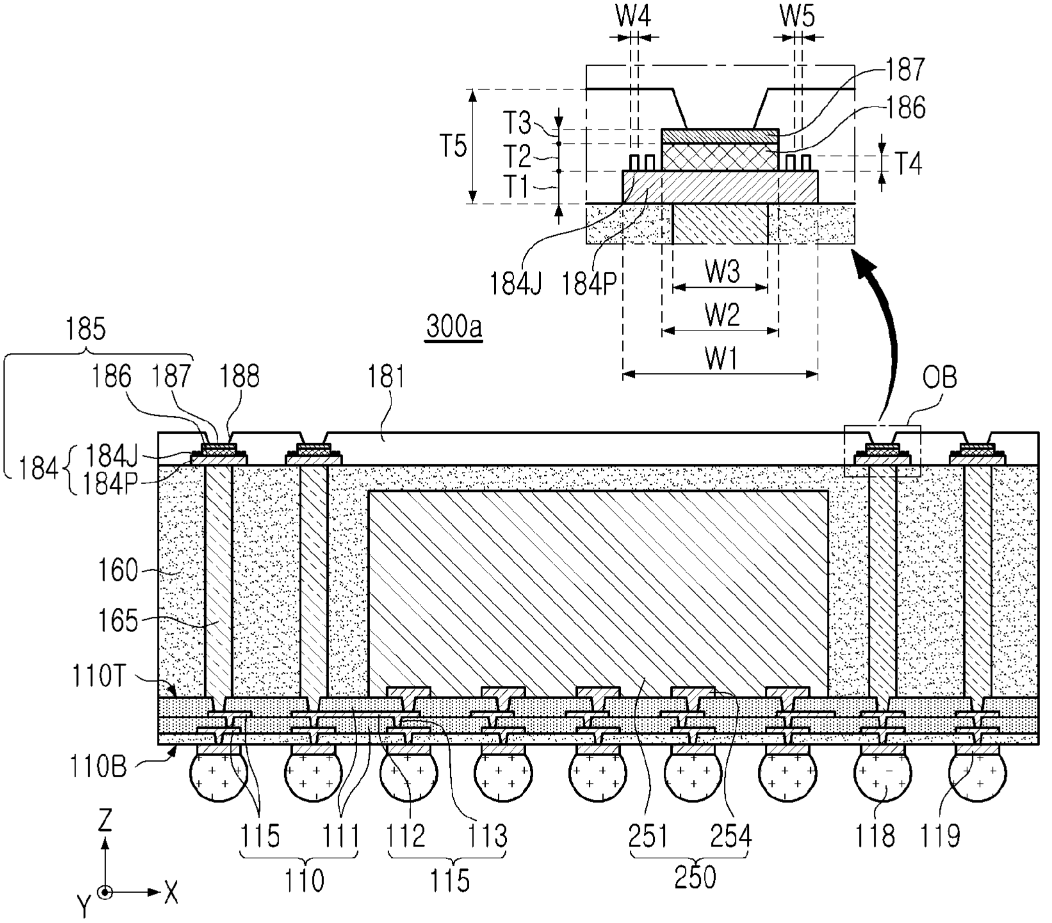
FIG. 1 is a cross-sectional view of a semiconductor package taken along an X-Z plane according to an example embodiment of the present inventive concept.

The following detailed description of the present inventive refers to the accompanying drawings which, by way of example, illustrate specific embodiments in which the present inventive concept may be practiced. These embodiments are described in sufficient detail to enable one skilled in the art to practice the present inventive concept. It should be understood that the various embodiments of the present inventive concept are different from each other but are not necessarily mutually exclusive. For example, an example embodiment of specific shapes, structures, and characteristics described herein may be implemented in another embodiment without departing from the spirit and scope of the present inventive concept. Additionally, it should be understood that the location or arrangement of individual components within each disclosed embodiment may be changed without departing from the spirit and scope of the present inventive concept. Accordingly, the detailed description set forth below is not intended to be taken in a limiting sense, and the scope of the present inventive concept is limited only by the appended claims, with all equivalents as claimed by those claims. Like reference numbers in the drawings indicate the same or similar function throughout the various aspects. Items described in the singular may be provided in plural, as can be seen, for example, in the drawings. Thus, the description of a single item that is provided in plural applies to the remaining plurality of items, unless the context or other statements indicate otherwise.

Hereinafter, example embodiments of the present inventive concept will be described in detail with reference to the accompanying drawings such that those skilled in the art may easily practice the present inventive concept.

In the drawings, the size and relative sizes of layers and regions may be exaggerated for clarity.

In the following description, it will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

As used herein, components described as being "electrically connected" are configured such that an electrical signal can be transferred from one component to the other (although such electrical signal may be attenuated in strength as it is transferred and may be selectively transferred). Moreover, components that are "directly electrically connected" share a common electrical node through electrical connections by one or more conductors, such as, for example, wires, pads, internal electrical lines, through vias, etc. As such, directly electrically connected components do not include components electrically connected through active elements, such as transistors or diodes.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The various pads of a device described herein may be conductive terminals connected to internal wiring of the device, and may transmit signals and/or supply voltages between an internal wiring and/or internal circuit of the device and an external source. For example, chip pads of a semiconductor chip may electrically connect to and transmit supply voltages and/or signals between an integrated circuit of the semiconductor chip and a device to which the semiconductor chip is connected. The various pads may be provided on or near an external surface of the device and may generally have a planar surface area (often larger than a corresponding surface area of the internal wiring to which they are connected) to promote connection to a further terminal, such as a bump or solder ball, and/or an external wiring.

Figure 7:
FIGS. 7 and 8 are plan views of a semiconductor package in a −Z direction according to an example embodiment of the present inventive concept.
Figure 7:
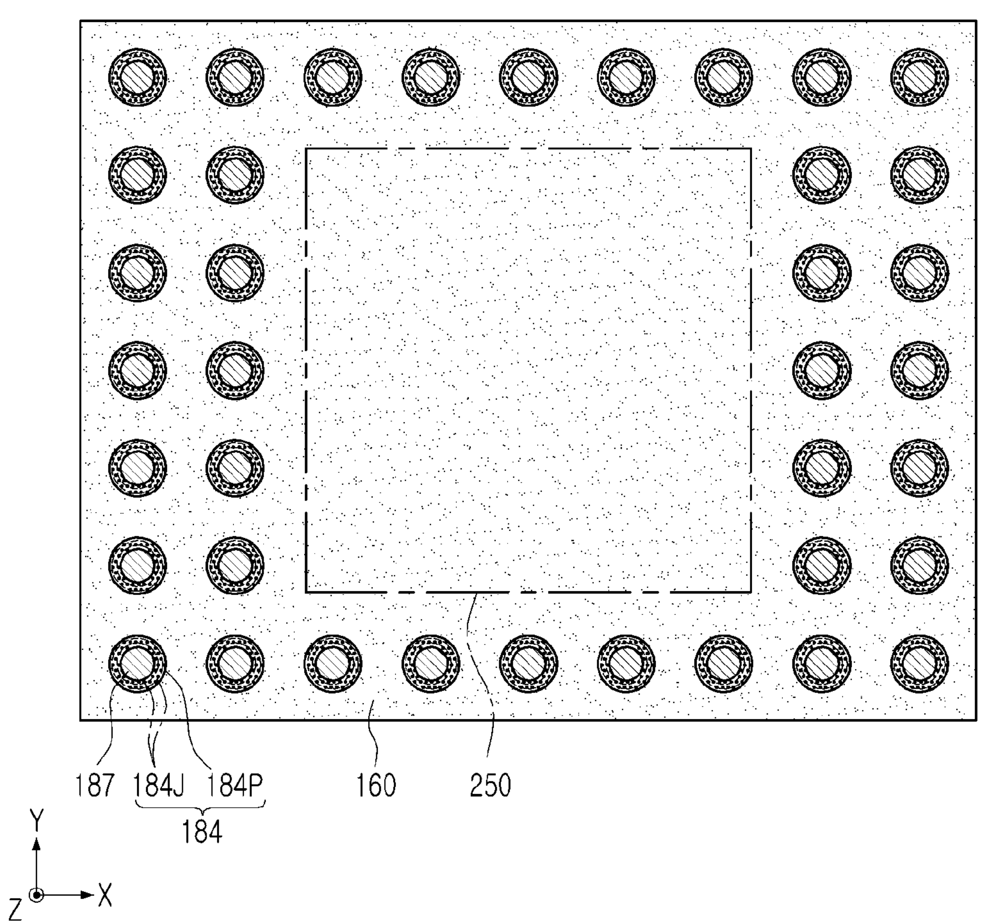

Referring to FIGS. 1 and 7, a semiconductor package 300*a* according to an example embodiment of the present inventive concept may include a first redistribution structure 110, a semiconductor chip 250, a second insulating layer 181, a pad 184, and pad surface layers 186 and 187. The pad surface layers 186 and 187 may include at least one of a first pad surface layer 186 and a second pad surface layer 187.

The semiconductor package 300*a* may be at least a portion of a system in package (SIP) or a portion of a package on package (POP) structure. For example, the semiconductor package 300*a* may be electrically connected to an additional semiconductor package or an additional semiconductor chip on an upper side thereof via a pad 184 and a bump, thereby forming a POP structure.

The first redistribution structure 110 may have a structure in which at least one first redistribution layer 112 and at least one first insulating layer 111 are alternately stacked. The at least one first redistribution layer 112 and at least one first insulating layer 111 may be alternately stacked in a stacking direction (e.g., Z-direction). The first redistribution structure 110 may further include first redistribution vias 113 extending from at least one first redistribution layer 112 in the stacking direction (for example, Z-direction) of the first redistribution structure 110. The first redistribution vias 113 may pass through the at least one first insulating layer 111.

The at least one first insulating layer 111 may be formed of and/or include an insulating material, and may include, for example, a thermosetting resin such as an epoxy resin or a thermoplastic resin such as polyimide. For example, the at least one first insulating layer 111 may be formed of and/or include a photosensitive insulating material such as a photo imageable dielectric (PID) resin. Alternatively, the at least one insulating layer 111 may be formed of and/or include a resin mixed with an inorganic filler, for example, an Ajinomoto Build-up Film (ABF). Alternatively, the at least one first insulating layer 111 may be formed of and/or include prepreg, flame retardant (FR-4), or bismaleimide triazine (BT). Each layer of the at least one first insulating layer 111 may be formed of and/or include the same material or different materials as other layers of the at least one first insulating layer 111. Depending on a material, a process, and the like of respective layers, a boundary therebetween may not be distinguishable.

The first redistribution layers 112 and the first redistribution vias 113 may form first electrical paths 115 in the first redistribution structure 110. The first redistribution layers 112 may be disposed in the form of at least one redistribution line on an X-Y plane, and the first redistribution vias 113 may have a cylindrical shape having side surfaces that are inclined such that a width thereof becomes narrower toward a lower portion thereof or an upper portion thereof. The first redistribution vias 113 are illustrated as a filled via structure completely filled with a conductive material, but the present inventive concept is not limited thereto. For example, the first redistribution vias 113 may have a form of a conformal via in which a metal material is formed along an inner wall of a via hole. The first redistribution layers 112 and the first redistribution vias 113 may be formed of and/or include a conductive material, for example, copper (Cu), aluminum (Al), silver (Ag), tin (Sn), gold (Au), nickel (Ni), lead (Pb), titanium (Ti), or alloys thereof. The first redistribution structure 110 may be electrically connected to the pad 184. For example, the first redistribution structure 110 may be electrically connected to the pad 184 via the first electrical paths 115 and conductive vias 165.

The semiconductor chip 250 may be electrically connected to the first redistribution structure 110, and may be disposed on an upper surface 110T of the first redistribution structure 110. For example, the semiconductor chip 250 may include a body portion 251 and connection pads 254, and may be electrically connected to the first electrical paths 115 via the connection pads 254, such that the semiconductor chip 250 may be electrically connected to the first redistribution structure 110.

For example, the connection pads 254 may be formed of and/or include a conductive material such as tungsten (W), aluminum (Al), copper (Cu), or the like, and may be a pad of a bare chip, for example, aluminum (Al) pad. However, in some example embodiments, the connections pads 254 may be a pad of a packaged chip, for example, a copper (Cu) pad. For example, the body portion 251 may contain a semiconductor material such as silicon (Si), germanium (Ge), gallium arsenide (GaAs), or the like, and a portion of the body portion 251 may be a device layer including an integrated circuit (IC).

A type of electrical connection between the connection pads 254 and the first redistribution structure 110 is not particularly limited. For example, the semiconductor chip 250 may be mounted on the first redistribution structure 110 via a lower surface thereof using flip-chip bonding, and may also be electrically connected to the first redistribution structure 110 via an upper surface of the semiconductor chip 250 using wire bonding. In embodiments using flip-chip bonding, the use of a bump may be selective (e.g., optional).

The semiconductor chip 250 may include a logic semiconductor chip and/or a memory semiconductor chip. The logic semiconductor chip may be a micro-processor, for example, a central processing unit (CPU), a graphic processing unit (GPU), a field programmable gate array (FPGA), a n application processor (AP), a digital signal processor, a cryptographic processor, a controller, or an application specific integrated circuit (ASIC). The memory semiconductor chip may be a volatile memory such as dynamic random access memory (DRAM), static random access memory (SRAM), or the like, or a non-volatile memory such as flash memory or the like.

The number of semiconductor chips 250 included in the semiconductor package **300*a* is not limited to one. For example, multiple semiconductor chips may be stacked in the Z-direction, and an electrical connection method between the semiconductor chips may be similar to an electrical connection method between the semiconductor chip 250 and the first redistribution structure 110**.

The second insulating layer 181 may have an opening 188. The second insulating layer 181 may contain, be formed of, and/or include at least a portion of insulating materials that may be contained in, formed of, and/or included in the first insulating layers 111. For example, the second insulating layer 181 may contain, be formed of, and/or include a build-up film effective for forming the opening 188 or a material that may be contained in a solder resist layer of a printed circuit board. For example, the build-up film may be an Ajinomoto build-up film (ABF). For example, the opening 188 may be formed using a photolithography method, and a form of a horizontal region of the opening 188 may be close to a circle.

The second insulating layer 181 may cover and contact at least a portion of pad 184. Opening 188 may overlap a center portion of the pad 184 in a vertical direction (for example, Z-direction), such that the second pad surface layer 187 disposed on the on the second insulating layer 181 is exposed. As used herein, overlapping in a certain direction may refer to portions of object occupying the same location as defined in two coordinates, but that are offset from one another in a third coordinate corresponding to the certain direction. For example, portions of objects that overlap in the vertical direction may have the same horizontal coordinates (e.g., X-Y coordinates), but have different vertical coordinates (e.g., Z coordinates). In some embodiments, the pad 184 may have a form of a circular or polygonal plate, and may contain, be formed of, and/or include at least a portion of materials that may be contained in, form, and/or be included in a redistribution line.

The first and second pad surface layers 186 and 187 may be disposed on a region of an upper surface of the pad 184 and may overlap the opening 188 (e.g., the lower end of the opening 188) in the vertical direction (for example, Z-direction), and may contain, be formed of, and/or include a conductive material (for example, Ni, Au, Ag, Pd, or alloys thereof) different from a conductive material (for example, Cu or an alloy of copper) of the pad 184. For example, the pad surface layers 186 and 187 may have a form of a circular or polygonal plate, and may have a width W2 narrower than a width W1 of the pad 184.

The pad 184 may be formed of and/or include a conductive material (for example, Cu or an alloy of copper) having high conductivity for electrical connection efficiency, and the conductive material may have high wettability with respect to a material (for example, a solder material and material forming and/or included in a bump). The high conductivity and wettability of the pad 184 may cause a strong interaction (for example, bonding force or attractive force) between the pad 184 and a bump. The interaction may be represented as copper consumption when the conductive material is copper, and may affect arrangement reliability of the pad 184. The pad surface layers 186 and 187 may contain, be formed of, and/or include a conductive material (for example, Ni, Au, Ag, Pd, or alloys thereof) different from that of the pad 184, thereby reducing the effect of the interaction on the arrangement reliability of the pad 184.

For example, the first pad surface layer 186 may contain nickel (Ni) or an alloy of nickel, and may be disposed between the second pad surface layer 187 and the pad 184. Nickel may have low chemical affinity with copper and may have resistance to diffusion of copper, thereby effectively reducing the effect of the interaction on the arrangement reliability of the pad 184.

The first and second pad surface layers 186 and 187 may contain, be formed of, and/or include different conductive materials. In the Z direction, the pad 184 may have a first thickness T1, the first pad surface layer 186 may have a second thickness T2, the second pad surface layer 187 have may a third thickness T3, and the second insulating layer 181 may have a fifth thickness T5. Each of thicknesses T2 and T3 of the first and second pad surface layers 186 and 187 may be thinner than the thickness T5 of the second insulating layer 181 and may be thinner than the thickness T1 of the pad 184, but the present inventive concept is not limited thereto.

For example, the second pad surface layer 187 may contain, be formed of, and/or include gold (Au) or an alloy of gold, and may be disposed on an upper surface of the first pad surface layer 186. Due to gold (Au) having high conductivity, high malleability and high ductility, the opening 188 may be more densely filled even when the opening 188 is relatively small. Accordingly, the second pad surface layer 187 may be advantageous for improving a degree of integration of the opening 188.

A group including the pad 184, the first pad surface layer 186, and the second pad surface layer 187 may be referred to as a combination structure 185. The number of combination structures 185 and the number of openings 188 may each be plural in number, and a large number of combination structures 185 may be present to correspond to the total number of paths electrically connected to the semiconductor package 300*a* and an external package or an external semiconductor chip on a upper side thereof. Accordingly, a ratio (corresponding to the degree of integration of the opening 188) of a total horizontal area of the opening(s) 188 to a total horizontal area of the second insulating layer 181 may not be low (e.g., the ratio may be greater than 0.5). As the performance of an external package or an external semiconductor chip on the upper side thereof increases, the ratio may increase (e.g., the ratio may be related to the relative performance of the semiconductor chip). As the ratio increases, a level of difficulty of reliably securing (for example, difficulty with delamination and cracking prevention performance) the pad 184 and the second insulating layer 181 may also increase.

As a reliability enhancement structure OB of the pad 184, the pad 184 may include a central portion 184P and an anchor portion 184J. The central portion 184P may have a form of a circular or polygonal plate. The anchor portion 184J may protrude upwardly (in the Z-direction) from a peripheral (e.g., edge) region (for example, a region surrounding a region in which the first pad surface layer 186 is disposed) of the upper surface of the pad 184. A region of the upper surface of the pad 184 in which the first pad surface layer 186 is disposed and a remaining region (i.e., the peripheral region) may form one plane, but the present inventive concept is not limited thereto.

The anchor portion 184J may protrude to a position (in the Z direction) higher than that of a lower surface of the first pad surface layer 186. An upper surface of the anchor portion 184J may be positioned on a level (in the Z direction) higher than that of the lower surface of the first pad surface layer 186. Alternatively, as illustrated in the enlarged portion of FIG. 6, the anchor portion 184J may have a form of a sawtooth disposed along an edge (e.g., triangular shaped protrusions or recesses on the peripheral region of upper surface) of the pad 184 to be inserted into and/or extend into the second insulating layer 181.

Accordingly, as compared to roughening the upper surface of the pad 184 in an attempt to improve adhesion between the pad 184 and the second insulating layer 181, the anchor portion 184J, as disclosed herein, may more efficiently improve the stability of an arrangement relationship between the second insulating layer 181 and the pad 184. The higher the anchor portion 184J protrudes, the more the stability of the arrangement relationship may be improved, and an interface between the second insulating layer 181 and the pad 184 (e.g., the surface area) may be more effectively widened or increased. As compared to roughening the upper surface of the pad 184, a form of a protrusion or sawtooth of the anchor portion 184J may more effectively widen or increase the interface between the second insulating layer 181 and the pad 184, thereby efficiently improving bonding force between the second insulating layer 181 and the pad 184.

A portion of the second insulating layer 181 may be inserted into a space between the anchor portion 184J and the first pad surface layer 186 which may make it more difficult for the second insulating layer 181 to be disengaged from the pad 184, thereby preventing delamination between the second insulating layer 181 and the pad 184 and preventing cracking due to bending of the second insulating layer 181 in response to partial disengagement of the second insulating layer 181. Delamination or cracking of the second insulating layer 181 may have the potential to cause an electrical short when a portion of a bump connected to a corresponding pad is connected to another pad. When a redistribution line is disposed around the second insulating layer 181, the redistribution line may be broken by delamination between the second insulating layer 181 and the pad 184. The anchor portion 184J may effectively reduce such reliability degradation factors.

Figure 8:
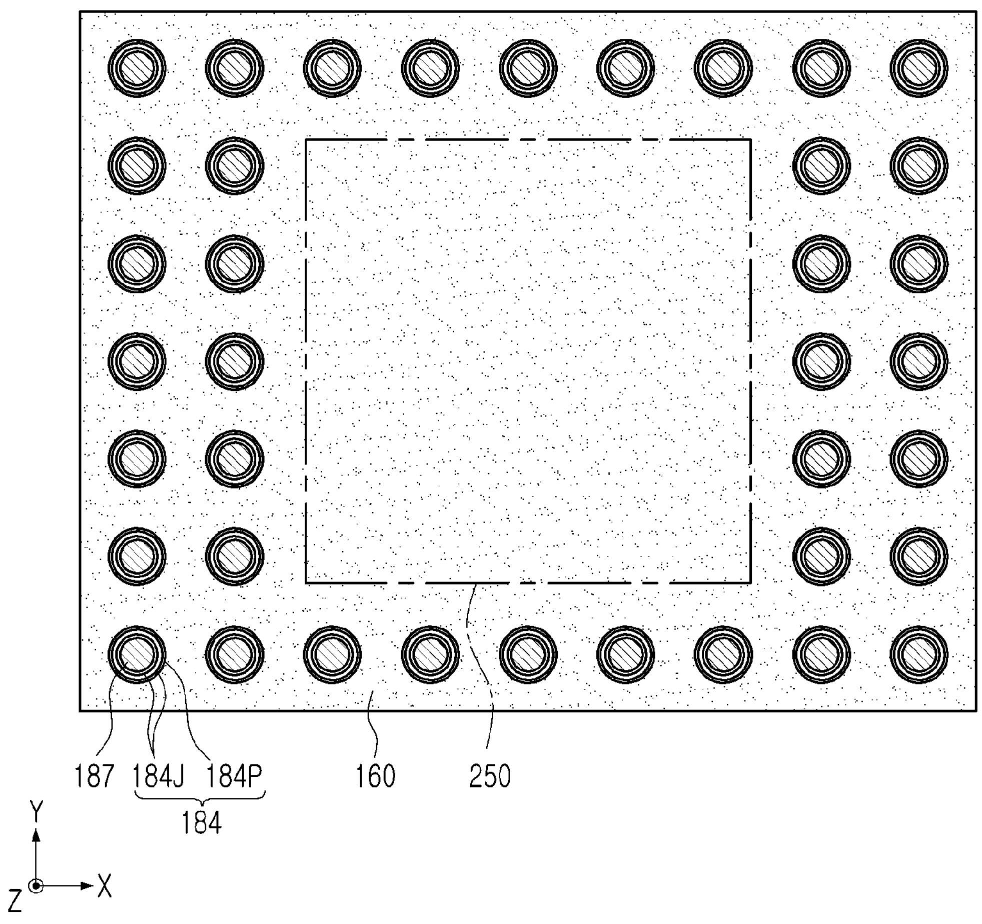

In one embodiment, the anchor portion 184J may comprise a plurality of pillar portions protruding in the Z direction, and the plurality of pillar portions may be arranged to surround the first pad surface layer 186 (disposed below the second pad surface layer 187) as shown in FIG. 7. Alternatively, referring to FIG. 8, an anchor portion 184J of a semiconductor package 300*f* according to an example embodiment of the present inventive concept may be formed as a plurality of concentric circles, with each concentric circle having an interior wall facing the first pad surface layer 186, and the interior walls may be horizontally offset from and surround the first pad surface layer 186. For example, the anchor portion 184J may be formed to surround the first pad surface layer 186 or may be arranged to surround the first pad surface layer 186.

As discussed above, a portion of the second insulating layer 181 may be inserted into a space between the anchor portion 184J and the first pad surface layer 186 to thereby surround the first pad surface layer 186. For example, in an embodiment in which the anchor portion 184J comprises a plurality of protrusions, a portion of the second insulating layer 181 may be inserted into spaces between the plurality of protrusions. In an embodiment in which the anchor portion 184J comprises a plurality of concentric circles, a portion of the second insulating layer 181 may be inserted into spaces between each of the concentric circles and the first pad surface layer 186. As used herein, the term anchor sub-portion may be used to refer to an individual protrusion of the plurality protrusions in one embodiment of the anchor portion 184J and an individual concentric circle of the plurality concentric circles in another embodiment of the anchor portion 184J. In the Z direction, the anchor sub portions of anchor portion 184J may have a thickness (e.g., protrusion length) T4. The protrusion length T4 of each anchor sub-portion may be longer (i.e., greater) than a width W4 of each anchor sub-portion. Accordingly, even when the anchor sub-portions (of the anchor portion 184J occupy a small horizontal area, the stability of the arrangement relationship between the second insulating layer 181 and the pad 184 may be improved. A width W5 of the inserted portion of the second insulating layer 181 between the anchor sub-portions may be shorter (i.e., less) than an insertion depth, and the insertion depth may be equal to the protrusion length T4. In one embodiment the protrusion length T4 of each anchor sub-portion may be substantially the same. In another embodiment, there may be a variation in the protrusion length T4 of each anchor sub-portion or a variation in the protrusion length T4 of subsets of the anchor sub-portions.

For example, a portion of an upper surface and a side surface of the second pad surface layer 187 may be in contact with the second insulating layer 181. Delamination or cracking of the second insulating layer 181 may start from the upper surface of the second pad surface layer 187, and a small contact area between the second pad surface layer 187 and the second insulating layer 181 may also negatively affect the stability of the arrangement relationship between the second insulating layer 181 and the pad 184. The anchor portion 184J disclosed herein may effectively improve the stability of the arrangement relationship between the second insulating layer 181 and the pad 184.

Referring to FIG. 1, the semiconductor package 300*a* according to an example embodiment may further include at least one of additional bumps 118, additional pads 119, an encapsulant 160, and a conductive via 165.

The additional bumps 118 may be disposed on a lower surface 110B of the first redistribution structure 110, and the first redistribution structure 110 may be mounted on an external substrate or package via the additional bumps 118. For example, the additional bumps 118 may have a form of a ball or pillar, and may be formed of and/or include a solder containing tin (Sn) or an alloy (Sn—Ag—Cu) containing tin (Sn). The additional bumps 118 may have a relatively low melting point as compared to other metal materials, and thus the additional pads 119 disposed on the lower surface 110B of the first redistribution structure 110 may be secured to the additional bumps 118 by a thermal compression bonding (TCB) process or a reflow process. Bumps that may be disposed in the opening 188 may be formed in a similar manner to the additional bumps 118.

The additional pads 119 may be formed in a similar manner to the pads 184, may have a width wider than a width of a redistribution line of the redistribution layer, and may have upper and lower surfaces having a form resembling a circle. For example, the additional pads 119 may be coupled and/or electrically connected to one of the first redistribution vias 113 and formed by a semi-additive process (SAP) or a modified semi-additive process (MSAP).

The encapsulant 160 may encapsulate the semiconductor chip 250 that is disposed on an upper surface of the first redistribution structure 110. The encapsulant 160 may fill a space between the first redistribution structure 110 and the second insulating layer 181, thereby improving robustness of the semiconductor chip 250 against external impacts, and also improving durability (for example, robustness against external impacts) or reliability (internal warpage prevention performance) of the semiconductor package 300*a*.

For example, the encapsulant 160 may contain, be formed of, and/or include a molding material such as an epoxy molding compound (EMC). However, the material that may form, be contained, and/or be included in the encapsulant 160 is not limited to the molding material, and the encapsulant 160 may contain, be formed of, or include an insulating material having protection properties similar to those of the molding material or high ductility. For example, the insulating material may be a build-up film (for example, the ABF), a thermosetting resin such as an epoxy resin or a thermoplastic resin such as polyimide, and may be an insulating material in which inorganic fillers and/or glass fibers are appropriately added to an insulating material of the second insulating layer 181.

The conductive via 165 may extend vertically (e.g., the Z direction) in the encapsulant and electrically connect the pad 184 to the first redistribution structure 110. For example, the conductive via 165 may protrude from a lower surface of the pad 184 and overlap the first and second pad surface layers 186 and 187 in a vertical direction, and thus may be understood as a portion of the pad 184. A width W3 of the conductive via 165 may be narrower than the width W1 of the pad 184, and may be constant or vary depending on a position thereof in a Z-direction.

A combination structure of the conductive via 165 and the pad 184, vertically overlapping each other, may form a strong reaction force against force applied from an upper side of the pad 184 toward the pad 184 (e.g., having a force component towards a center of mass of the pad 184). Accordingly, a level of difficulty in securing the stability of the arrangement relationship between the second insulating layer 181 and the pad 184 may be further increased due to the combination structure. The anchor portion 184J disclosed herein may effectively improve the stability of the arrangement relationship between the second insulating layer 181 and the pad 184 to overcome the increase in the level of difficulty due to the combination structure.

The conductive vias 165 may pass through the encapsulant 160 and may be copper posts of a wafer level package (WLP). For example, the conductive vias 165 may be formed prior to the encapsulant 160 being formed, and may be formed by a process of plating a metallic material (for example, copper) or filling a conductive paste into through-holes of a temporarily formed photo resist prior to the encapsulant 160 being formed.

The conductive via 165 may have a hardness higher than the hardness of the encapsulant 160, such that reaction properties of the conductive via 165 and the encapsulant 160 against a vertical force may be different from each other. Accordingly, a level of difficulty of securing the stability of the arrangement relationship between the second insulating layer 181 and the pad 184 may be increased due to the difference in hardness. The anchor portion 184J disclosed herein may efficiently improve the stability of the arrangement relationship between the second insulating layer 181 and the pad 184 to overcome the increase in the level of difficulty due to the difference in hardness.

Referring to FIGS. 2A to 2I, according to a method of manufacturing a semiconductor package according to an example embodiment of the present inventive concept, the semiconductor package 300*a* of FIG. 1 may be manufactured sequentially from a first structure 300*a*-1 to a ninth structure 300*a*-9. The semiconductor package 300*a* of FIG. 1 is not to be construed as being limited by the semiconductor package manufacturing method described in relation to FIGS. 2A to 2I.

Figure 2A:
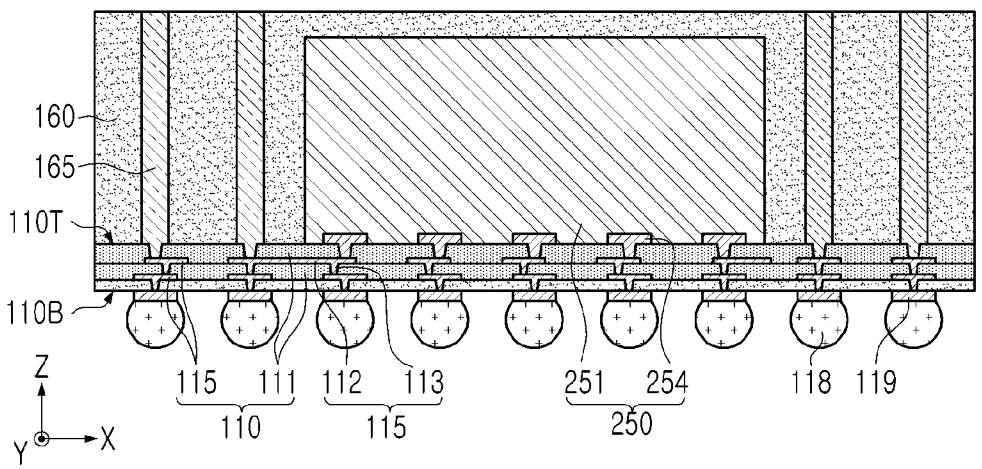
FIGS. 2A to 2I are cross-sectional views illustrating a method of manufacturing a semiconductor package according to an example embodiment of the present inventive concept.
Figure 2B:
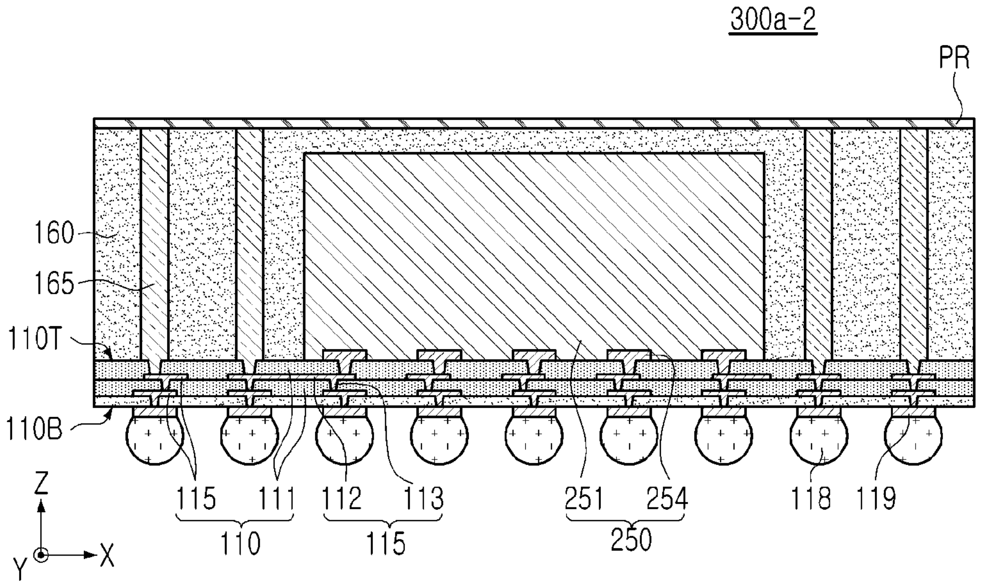

Referring to FIGS. 2A and 2B, a second structure 300*a*-2 may be a structure in which a photoresist PR is formed on an existing structure, such as the structure 300*a*-1 of FIG. 2A, by a stacking method, as compared to the first structure 300*a*-1.

Figure 2C:
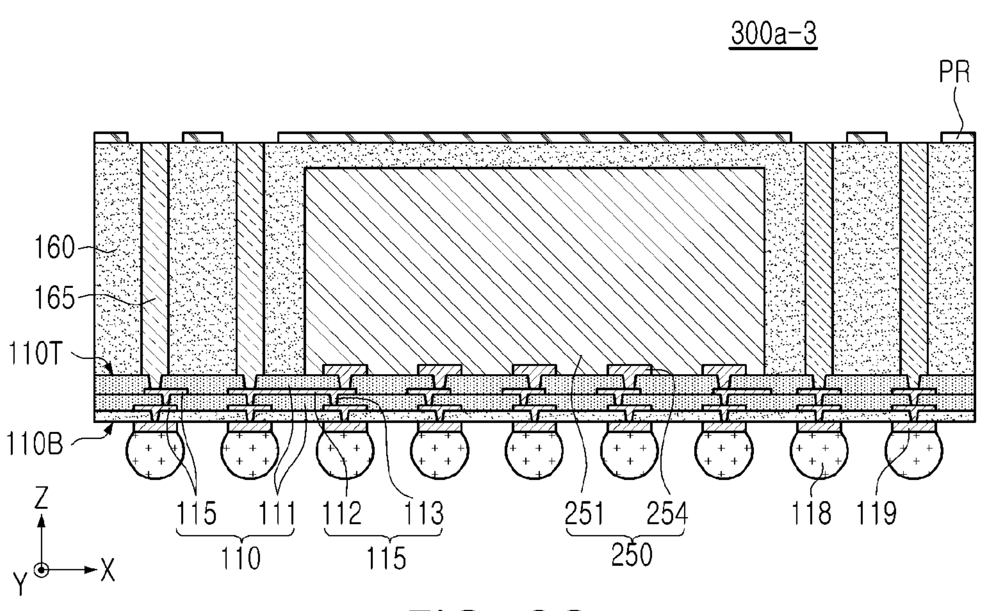

Referring to FIGS. 2B and 2C, a third structure 300*a*-3 may be a structure in which a portion of the photoresist PR of the second structure 300*a*-2 is etched by a photolithography method.

Figure 2D:
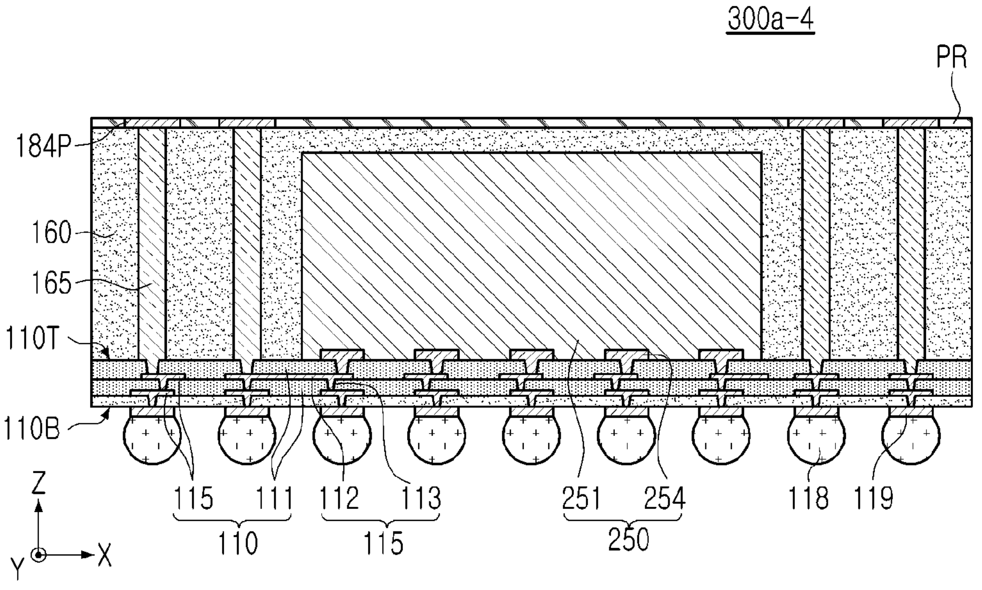

Referring to FIGS. 2C and 2D, a fourth structure 300*a*-4 may be a structure in which a hole in the photoresist PR is filled with a central portion 184P of a pad, as compared to the third structure 300*a*-3.

Figure 2E:
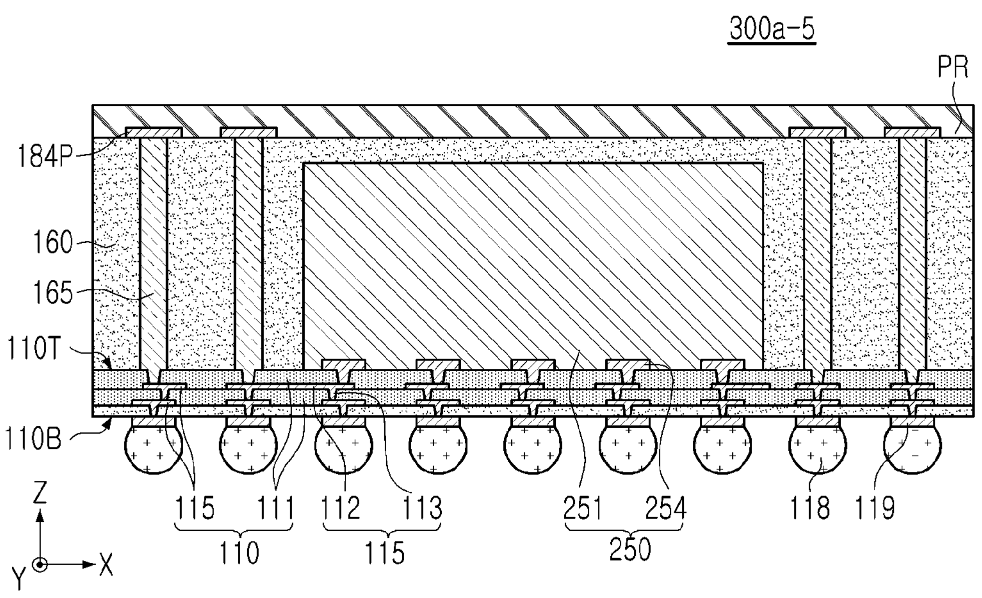

Referring to FIGS. 2D and 2E, a fifth structure 300*a*-5 may be a structure in which the photoresist PR becomes thicker by a stacking method, as compared to the fourth structure 300*a*-4.

Figure 2F:
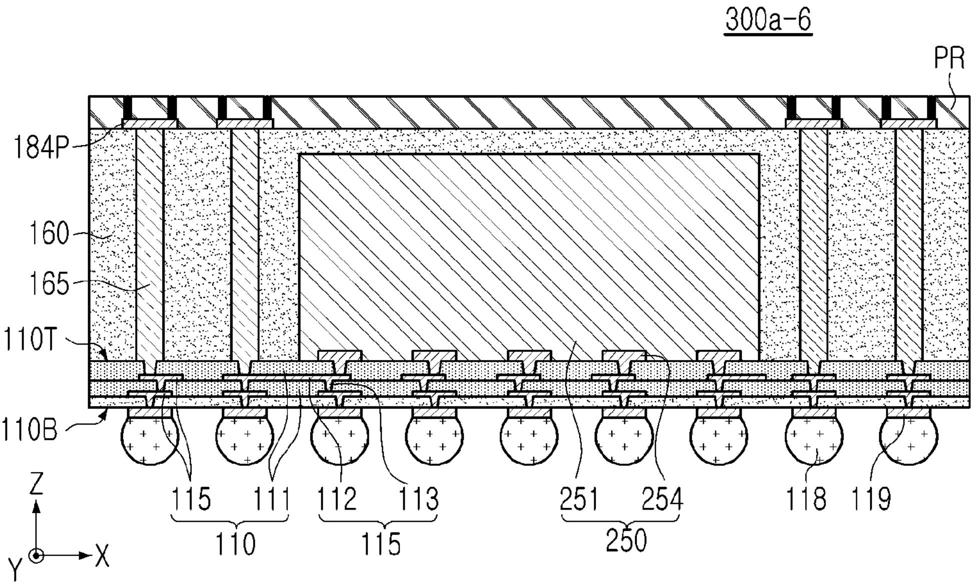

Referring to FIGS. 2E and 2F, a sixth structure 300*a*-6 may be a structure in which a portion of the photoresist PR of the fifth structure 300*a*-5, is etched by the photolithography method to form recesses extending in a vertical direction (Z direction) in the photoresist PR.

Figure 2G:
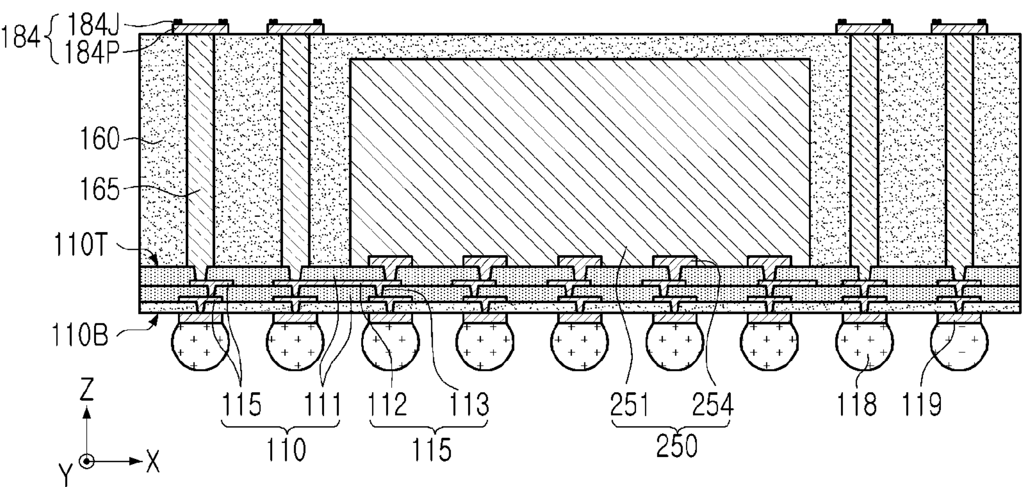

Referring to FIGS. 2F and 2G, a seventh structure 300*a*-7 may be a structure in which the recesses extending in the vertical direction in the photoresist PR are filled with an anchor portion 184J, and the photoresist PR is removed (e.g., by etching).

Figure 2H:
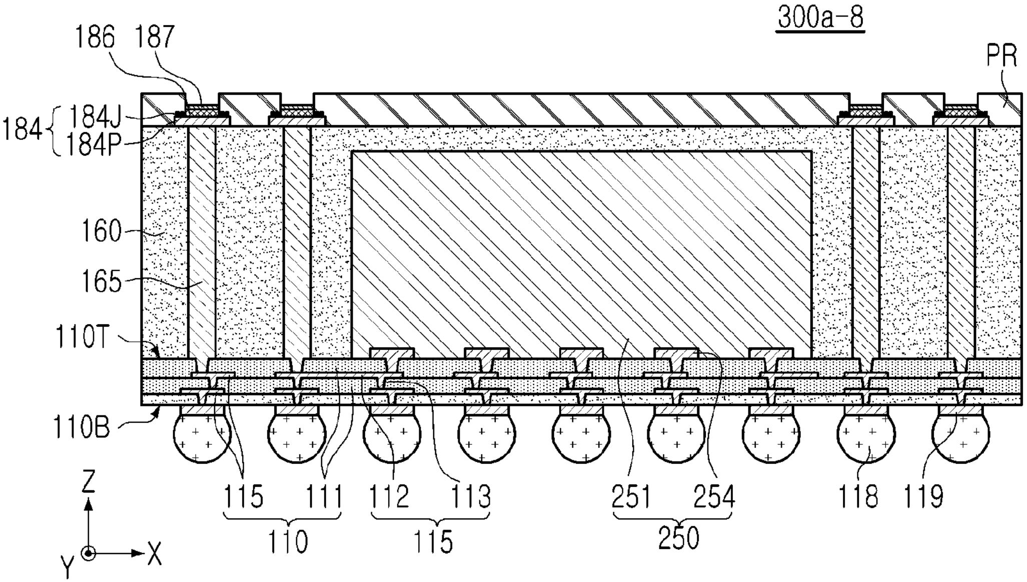

Referring to FIGS. 2G and 2H, an eighth structure 300*a*-8 may be a structure, such as the seventh structure 300*a*-7, in which a photoresist PR is formed by a stacking method, as compared to the seventh structure 300*a*-7, and a hole in the photoresist PR is filled with first and second pad surface layers 186 and 187. The hole in the photoresist PR may be formed by etching a portion of the photoresist PR by photolithography after the photoresist PR is formed. Alternatively, with respect to the sixth structure 300*a*-6, the photoresist PR may not be removed subsequent to filling the recesses with anchor portion 184J. Instead, the photoresist PR of the sixth structure 300*a*-6 may be etched to form a hole in the photoresist PR which is filled with first and second pad surface layers 186 and 187 to thereby form the eight structure 300*a*-8 as illustrated in FIG. 2H.

Figure 2I:
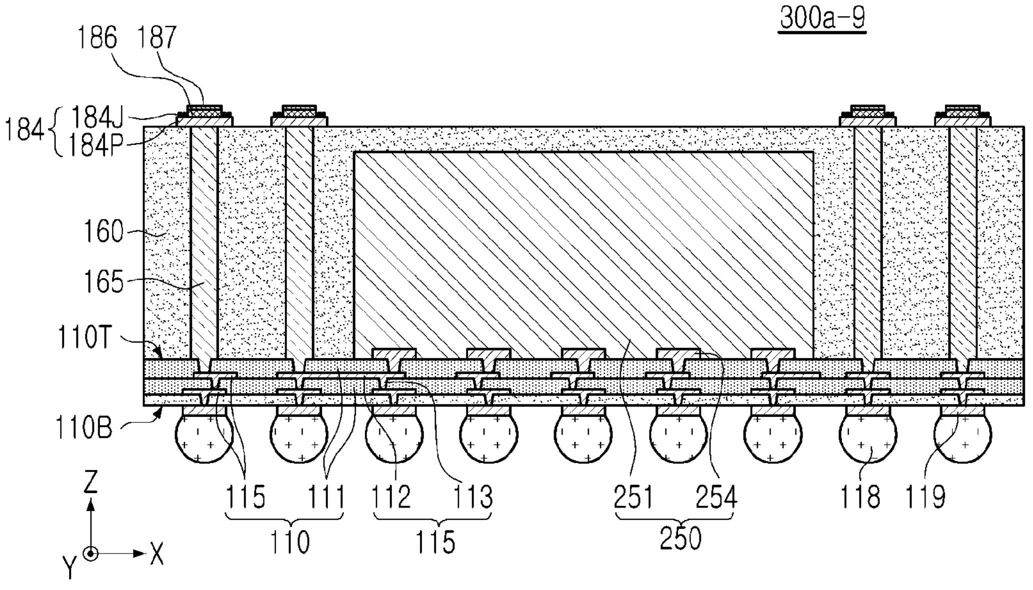

Referring to FIGS. 2H and 2I, a ninth structure 300*a*-9 may be a structure in which the photoresist PR of the eighth structure 300*a*-8 is etched. Thereafter, the second insulating layer 181 of FIG. 1 may be additionally formed.

Figures 3, 4:
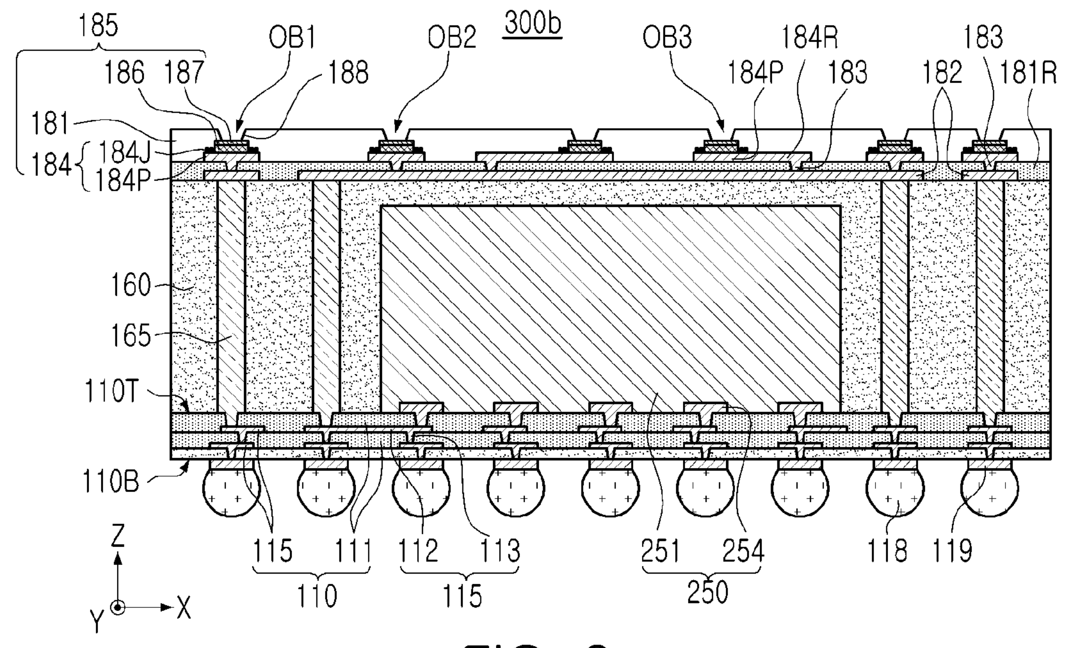
FIG. 3 is a cross-sectional view illustrating various arrangement relationships between a pad and a conductive via of a semiconductor package according to an example embodiment of the present inventive concept.
FIG. 4 is a cross-sectional view illustrating one of additional arrangement positions of a pad and an anchor portion of a semiconductor package according to an example embodiment of the present inventive concept.

Referring to FIG. 3, a semiconductor package 300*b* according to an example embodiment of the present inventive concept may include at least one of a first reliability enhancement structure OB1, a second reliability enhancement structure OB2, and a third reliability enhancement structure OB3.

The semiconductor package 300*b* according to an example embodiment of the present inventive concept may further include at least one of an additional second insulating layer 181R and a second redistribution layer 182. The additional second insulating layer 181R and the second insulating layer 181 may be similar, with the exception that the additional second insulating layer 181R may not have an opening 188 formed.

A portion of the additional second insulating layer 181R may be disposed on a lower surface of the pad 184. For example, the additional second insulating layer 181R may contain, be formed of, and/or include a build-up film in the same manner as the second insulating layer 181, and may provide an arrangement region for the second redistribution layer 182. Alternatively, the additional second insulating layer 181R may be implemented in a similar manner to the first insulating layers 111. The number of the additional second insulating layers 181R and the number of the second redistribution layers 182 are not limited to one. When the number of the additional second insulating layers 181R and the number of the second redistribution layers 182 are plural in number, the additional second insulating layers 181R and the second redistribution layers 182 may be alternately stacked and additional conductive vias may electrically connect the second redistribution layers 182 through the additional second insulating layers 181R.

The additional second insulating layer 181R may be disposed between the second insulating layer 181 and the encapsulant 160, and may contain, be formed of, and/or include an insulating material different from that of the encapsulant 160. The additional second insulating layer 181R may be in contact with each of the second insulating layer 181, the encapsulant 160, and the pad 184.

The second redistribution layer 182 may be electrically connected to at least a portion (e.g., at least one) of the pads 184 through conductive via 183. The second redistribution layer 182 may be electrically connected to at least a portion (e.g., at least one) of the conductive 183. Accordingly, a horizontal electrical connection path between a respective pad 184, respective conductive vias 165 and 183 may be formed. The second redistribution layer 182 may be implemented in a similar manner to the first redistribution layers 112.

The central portion 184P of pads 184 of the first and second reliability enhancement structures OB1 and OB2 may overlap conductive vias 183 in a vertical direction. However, the central portion 184P of pads 184 of the third reliability enhancement structure OB3 may not overlap the conductive vias 183 in the vertical direction. The central portion 184P of pads 184 of the third reliability enhancement structure OB3 may be horizontally offset from the conductive vias 183 and may be connected to the conductive vias 183 through a redistribution line 184R (e.g., the pad 184P may extend horizontally to form a redistribution line 184R).

A redistribution line of the second redistribution layer 182 may cross a side surface of the pad 184 on a lower side of the pad 184 (e.g., cross under the pad 184). When the stability of an arrangement relationship between the second insulating layer 181 and the pad 184 is low, delamination or cracking that may occur in the second insulating layer 181 may apply stress to the lower side of the pad 184 via the side surface of the pad 184. When the second insulating layer 181 and the additional second insulating layer 181R are in contact with each other, the stress may be more concentrated. The stress may negatively affect the reliability of the redistribution line and the anchor portion 184J may effectively improve the stability of the arrangement relationship between the second insulating layer 181 and the pad 184, thereby improving the reliability of the redistribution line.

Referring to FIG. 4, a semiconductor package 300*c* according to an example embodiment of the present inventive concept may include a fourth reliability enhancement structure OB4 disposed on a lower side of a first redistribution structure 110. The fourth reliability enhancement structure OB4 may be similar to the first reliability enhancement structure OB1 that is described in relation to FIG. 1, with the exception that the fourth reliability enhancement structure OB4 may be inverted in the vertical direction. Additional pads 119P may also include an anchor portion 119J implemented in a similar manner to the anchor portion 184J of FIG. 1. First and second pad surface layers 116 and 117 may also be implemented in a similar manner to the first and second pad surface layers 186 and 187 of FIG. 1. A second insulating layer 111F may also be implemented in a similar manner to the insulating layer 181 of FIG. 1.

Figure 5:
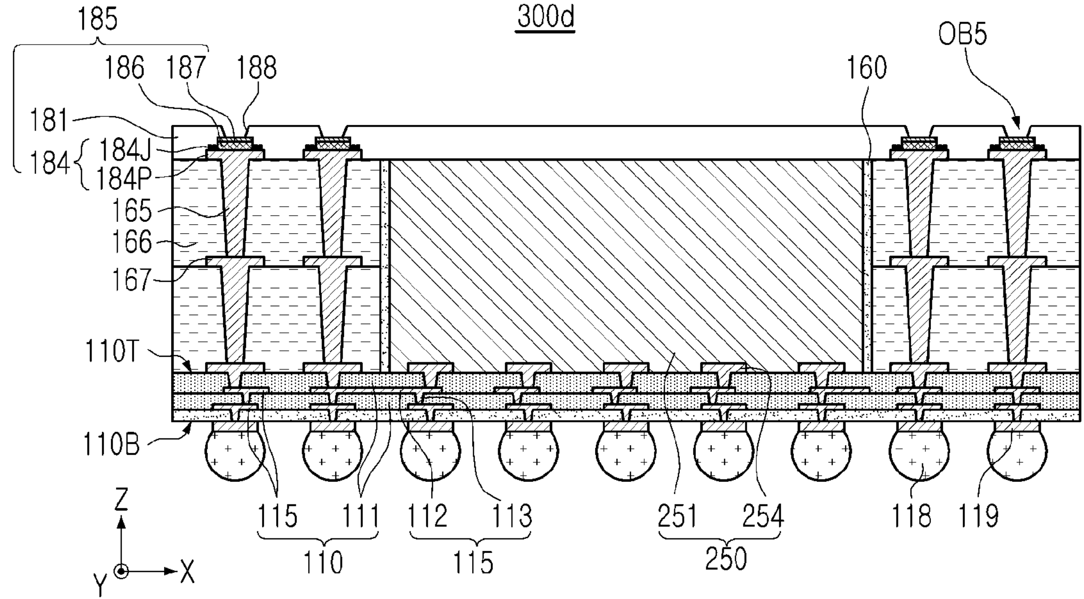
FIG. 5 is a cross-sectional view illustrating a core insulating layer that may be added to a semiconductor package according to an example embodiment of the present inventive concept.

Referring to FIG. 5, a semiconductor package 300*d* according to an example embodiment of the present inventive concept may further include at least one of a core insulating layer 166 and a core wiring layer 167, may have a panel level package (PLP) structure, and may include a fifth reliability enhancement structure OB5. The fifth reliability enhancement structure OB5 may be implemented in a similar manner to the reliability enhancement structure OB of FIG. 1.

The core insulating layer 166 may surround the semiconductor chip 250 and the encapsulant 160. For example, the core insulating layer 166 may be formed of and/or include an insulating material similar to an insulating material of a core disposed in a central portion of a printed circuit board, and may be formed from a copper clad laminate (CCL). The core insulating layer 166 may have rigidity higher than that of the first insulating layer 111 or may be thicker than the first insulating layer 111, thereby reducing the potential for warpage of the semiconductor package 300*d*. The number of layers of core insulating layer 166 is not particularly limited. Each of conductive vias 165 may pass through the core insulating layer 166.

The core wiring layer 167 may be disposed on an upper surface and/or lower surface of the core insulating layer 166, may be electrically connected to the conductive vias 165, and may be formed in a similar manner to a wiring layer of the printed circuit board.

Figure 6:
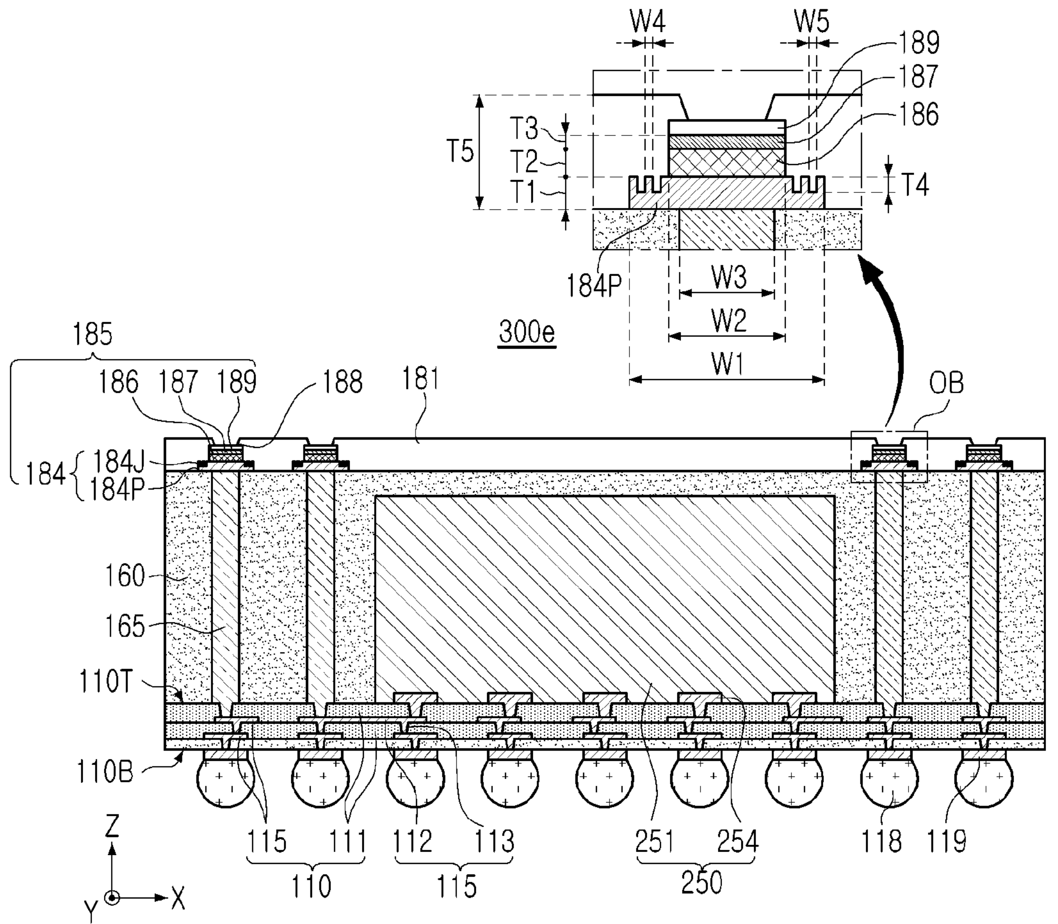
FIG. 6 is a cross-sectional view illustrating one of additional forms of an anchor portion of a semiconductor package according to an example embodiment of the present inventive concept.

Referring to FIG. 6, a semiconductor package 300*e* according to an example embodiment of the present inventive concept may further include a surface treatment layer 189. The surface treatment layer 189 may have, be formed of, and/or include a material different from those of first and second pad surface layers 186 and 187, and may be configured to increase contact between the first and second pad surface layers 186 and 187 and a bump, or may be configured to protect the first and second pad surface layers 186 and 187 from permeation or overflow of a material of the bump.

Referring to FIG. 6, the anchor portion 184J of the semiconductor package 300*e* according to an example embodiment of the present inventive concept may have a depressed form rather than the protruding form of FIG. 1. For example, the anchor portion 184J of FIG. 6 may be formed using a method of etching a portion of a pad 184, rather than a method of filling a hole of the photoresist PR of FIG. 2F with a conductive material. The anchor portion 184J of FIG. 6 may take the form of columnar recesses or a ringed trough (e.g., may be the inverse of the previously described anchor portions).

A semiconductor package according to an example embodiment of the present inventive concept may efficiently improve reliability (for example, delamination and cracking prevention performance) of a combination structure of a pad and an insulating layer.

While example embodiments have been illustrated and described above, it will be apparent to those skilled in the art that modifications and variations could be made without departing from the scope of the present inventive concept as defined by the appended claims.

What is claimed is:

1. A semiconductor package comprising:

a first redistribution structure having at least one first redistribution layer and at least one first insulating layer that are alternately stacked;

a semiconductor chip electrically connected to the first redistribution structure;

a second insulating layer disposed above the semiconductor chip and having an opening extending through the second insulating layer;

a pad electrically connected to the first redistribution structure, disposed below the second insulating layer, and overlapping the opening in a vertical direction; and a pad surface layer disposed on a first region of an upper surface of the pad to overlap the opening in the vertical direction, the pad surface layer formed of a first conductive material different from a second conductive material forming the pad, wherein the pad has an anchor portion protruding from a second region of the upper surface of the pad that does not overlap the opening in the vertical direction, and the anchor portion protrudes vertically into the second insulating layer to a position higher than that of a lower surface of the pad surface layer.

2. The semiconductor package of claim 1, wherein a portion of the second insulating layer extends into a space between the anchor portion and the pad surface layer.

3. The semiconductor package of claim 1, wherein the anchor portion surrounds the pad surface layer in a horizontal direction.

4. The semiconductor package of claim 3, wherein the anchor portion comprises a plurality of anchor sub-portions and a portion of the second insulating layer extends into between anchor sub-portions to surround the pad surface layer.

5. The semiconductor package of claim 4, wherein each of the anchor sub-portions protrudes into the second insulating layer for a distance that is longer than a width of each of the anchor sub-portions.

6. The semiconductor package of claim 1, wherein the pad surface layer includes a first pad surface layer and a second pad surface layer, the first pad surface layer and the second pad surface layer are each formed of different conductive materials, and the first pad surface layer is disposed between the second pad surface layer and the pad.

7. The semiconductor package of claim 6, wherein the pad is formed of copper (Cu) or an alloy of copper, the first pad surface layer is formed of nickel (Ni) or an alloy of nickel, and the second pad surface layer is formed of gold (Au) or an alloy of gold.

8. The semiconductor package of claim 1, wherein the second insulating layer contains a build-up film.

9. The semiconductor package of claim 1, wherein a side surface and a first portion of an upper surface of the pad surface layer are in contact with the second insulating layer, and a second portion of the upper surface of the pad surface layer is exposed by the opening of the second insulating layer.

10. The semiconductor package of claim 9, further comprising:

an additional second insulating layer having a portion in contact with the lower surface of the pad, the additional second insulating layer containing a build-up film, wherein the additional second insulating layer is in contact with a lower surface of the second insulating layer.

11. The semiconductor package of claim 1, further comprising:

an encapsulant disposed between the first redistribution structure and the second insulating layer to encapsulate the semiconductor chip.

12. The semiconductor package of claim 11, wherein the pad has a conductive via protruding from the lower surface of the pad and overlapping the pad surface layer in a vertical direction, and the conductive via passes through the encapsulant.

13. The semiconductor package of claim 1, wherein the pad is disposed at a lower surface of the second insulating layer.

14. A semiconductor package comprising:

a first redistribution structure having at least one first redistribution layer and at least one first insulating layer that are alternately stacked;

a semiconductor chip disposed above the first redistribution structure;

a second insulating layer disposed above the semiconductor chip and having an opening at an upper surface of the second insulating layer;

a pad electrically connected to the first redistribution structure, disposed below the second insulating layer, and overlapping the opening in a vertical direction;

a first pad surface layer disposed on a first region of an upper surface of the pad to overlap the opening, the first pad surface layer formed of nickel (Ni) or an alloy of nickel;

a second pad surface layer disposed on an upper surface of the first pad surface layer and overlapping the opening, the second pad surface layer formed of gold (Au) or an alloy of gold; and an encapsulant disposed between the first redistribution structure and the second insulating layer, the encapsulant encapsulating the semiconductor chip, wherein the pad has an anchor portion protruding into the second insulating layer from a second region of the upper surface of the pad that does not overlap the opening in a vertical direction, the anchor portion protrudes to a position higher than that of a lower surface of the first pad surface layer, and a portion of the second insulating layer is disposed in a space between the anchor portion and the first pad surface layer.

15. The semiconductor package of claim 14, further comprising:

an additional second insulating layer disposed between the second insulating layer and the encapsulant, the additional second insulating layer in contact with the second insulating layer, the additional second insulating layer containing an insulating material different from that of the encapsulant; and a second redistribution layer disposed on the additional second insulating layer, wherein a redistribution line of the second redistribution layer crosses underneath a lower side of the pad.

16. A semiconductor package comprising:

a first redistribution structure having at least one first redistribution layer and at least one first insulating layer that are alternately stacked;

a semiconductor chip electrically connected to the first redistribution structure;

a second insulating layer disposed above the semiconductor chip and having an opening;

a pad electrically connected to the first redistribution structure, disposed below the second insulating layer, and overlapping the opening;

a pad surface layer disposed on a first region of an upper surface of the pad to overlap the opening, the pad surface layer formed of a first conductive material different from a second conductive material forming the pad;

an additional second insulating layer having a portion disposed on a lower surface of the pad; and a second redistribution layer disposed on the additional second insulating layer, wherein the pad has an anchor portion protruding from a second region of the upper surface of the pad, the anchor portion protrudes to a position higher than that of a lower surface of the pad surface layer, a redistribution line of the second redistribution layer crosses under a side surface of the pad.

17. The semiconductor package of claim 16, wherein a width of the pad surface layer is narrower than a width of the pad.

18. The semiconductor package of claim 17, wherein the pad surface layer includes:

a second pad surface layer containing gold (Au) or an alloy of gold; and a first pad surface layer containing nickel (Ni) or an alloy of nickel, the first pad surface layer disposed between the second pad surface layer and the pad.

19. The semiconductor package of claim 18, wherein the second insulating layer contains a build-up film, and a side surface and a first portion of an upper surface of the second pad surface layer are in contact with the second insulating layer, and a second portion of the upper surface of the pad surface layer is exposed by the opening of the second insulating layer.

20. The semiconductor package of claim 19, further comprising:

an encapsulant disposed between the first redistribution structure and the second insulating layer, the encapsulant encapsulating the semiconductor chip, wherein the conductive via passes through the encapsulant.

21. The semiconductor package of claim 16, wherein the pad is disposed at a lower surface of the second insulating layer, the second region of the upper surface of the pad does not overlap the opening in a vertical direction, and the anchor portion protrudes vertically into the second insulating layer to a position higher than that of the lower surface of the pad surface layer.

* * * * *